United States Patent
Zhang et al.

(10) Patent No.: US 11,251,630 B2
(45) Date of Patent: Feb. 15, 2022

(54) BATTERY MANAGEMENT SYSTEM WITH WIRELESS COMMUNICATION UNIT

(71) Applicant: Contemporary Amperex Technology Co., Limited, Ningde (CN)

(72) Inventors: Wei Zhang, Ningde (CN); Zhimin Dan, Ningde (CN); Yizhen Hou, Ningde (CN); Jia Xu, Ningde (CN); Jiechao Luo, Ningde (CN); Wenbin Lu, Ningde (CN); Teng Yu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 191 days.

(21) Appl. No.: 16/559,645

(22) Filed: Sep. 4, 2019

(65) Prior Publication Data
US 2020/0083722 A1 Mar. 12, 2020

(30) Foreign Application Priority Data
Sep. 12, 2018 (CN) .......................... 201811061717.1

(51) Int. Cl.
*H02J 7/00* (2006.01)
*G01R 31/382* (2019.01)
(Continued)

(52) U.S. Cl.
CPC .......... *H02J 7/0021* (2013.01); *G01R 31/382* (2019.01); *G01R 31/396* (2019.01); *H02J 7/0014* (2013.01); *H01M 10/4257* (2013.01)

(58) Field of Classification Search
CPC ...... H02J 7/0021; H02J 7/0014; H02J 7/0016; H02J 7/005; H02J 7/0048; H02J 7/0013;
(Continued)

(56) References Cited

U.S. PATENT DOCUMENTS 6,025,695 A * 2/2000 Friel ................. H02J 7/00036
320/106
6,184,660 B1 * 2/2001 Hatular ................. H02J 7/022
320/141
(Continued)

FOREIGN PATENT DOCUMENTS

CN 102806858 A 12/2012
CN 104065112 A 9/2014
(Continued)

OTHER PUBLICATIONS

Extended European Search Report for European Application No. 19196378.4, dated Feb. 7, 2020, 9 pages.
(Continued)

*Primary Examiner* — John T Trischler
(74) *Attorney, Agent, or Firm* — Law Offices of Liaoteng Wang

(57) ABSTRACT

The battery management system comprises: a battery management unit, configured to receive status information of a battery module and status information of a battery pack, and transmit a control instruction to cell measurement circuits; the cell measurement circuits, configured to collect the status information of the battery module, transmit the status information of the battery module to the battery management unit, receive and execute the control instruction transmitted from the battery management unit; sensing units, configured to collect the status information of the battery pack, and transmit the status information of the battery pack to the battery management unit; wherein a wireless communication unit is disposed in the battery management unit, and a wireless communication unit is disposed in at least a portion of the cell measurement circuits and/or at least a portion of the sensing units.

7 Claims, 5 Drawing Sheets

(51) Int. Cl.
*G01R 31/396* (2019.01)
*H01M 10/42* (2006.01)
(58) Field of Classification Search
CPC .. H02J 7/00032; G01R 31/382; G01R 31/396
USPC ........................................................ 320/134
See application file for complete search history.

(56) References Cited

U.S. PATENT DOCUMENTS

| | | | | |
|---|---|---|---|---|
| 7,595,608 | B2* | 9/2009 | Gangstoe | H02J 7/0029 320/128 |
| 9,060,337 | B2* | 6/2015 | Sanders | H02J 4/00 |
| 9,125,462 | B2* | 9/2015 | Akin | H02J 50/12 |
| 9,144,026 | B2* | 9/2015 | Sanders | B60R 16/03 |
| 9,272,634 | B2* | 3/2016 | Li | B60W 10/26 |
| 9,282,518 | B2* | 3/2016 | Sanders | G08C 17/02 |
| 9,289,039 | B2* | 3/2016 | Akin | H02J 50/80 |
| 9,381,825 | B2* | 7/2016 | Li | G01R 31/367 |
| 9,496,749 | B2* | 11/2016 | Noda | H02J 7/1461 |
| 9,539,912 | B2* | 1/2017 | Li | B60L 50/61 |
| 9,559,530 | B2* | 1/2017 | Lee | H02J 13/0003 |
| 9,564,762 | B2* | 2/2017 | Lee | H02J 7/0016 |
| 9,660,462 | B2* | 5/2017 | Jeon | H02J 7/0029 |
| 9,718,455 | B2* | 8/2017 | Yu | B60W 10/06 |
| 9,882,401 | B2* | 1/2018 | Beaston | H02J 7/0047 |
| 10,128,550 | B2* | 11/2018 | Lebreux | H01M 10/625 |
| 10,270,266 | B2* | 4/2019 | Beaston | H02J 7/0068 |
| 10,361,467 | B2* | 7/2019 | Kubo | H01M 50/20 |
| 10,388,163 | B2* | 8/2019 | Nordbruch | B62D 15/0285 |
| 10,396,589 | B2* | 8/2019 | Kamikawa | H01M 10/425 |
| 10,404,081 | B2* | 9/2019 | Ota | H02J 7/0021 |
| 10,451,679 | B2* | 10/2019 | Jeon | G01R 31/3648 |
| 10,627,451 | B2* | 4/2020 | Karner | G01R 31/392 |
| 10,656,209 | B2* | 5/2020 | Jeon | H02J 7/0016 |
| 10,684,330 | B2* | 6/2020 | Karner | H02J 7/00032 |
| 10,718,797 | B2* | 7/2020 | Zhang | G01R 19/10 |
| 10,725,110 | B2* | 7/2020 | Dan | G01R 19/0092 |
| 10,756,770 | B2* | 8/2020 | Hou | H04B 1/0025 |
| 10,816,607 | B2* | 10/2020 | Karner | G01W 1/00 |
| 10,823,784 | B2* | 11/2020 | Dan | G01R 15/202 |
| 10,823,786 | B2* | 11/2020 | Karner | H02J 7/00032 |
| 10,830,826 | B2* | 11/2020 | Karner | G01R 31/374 |
| 10,830,827 | B2* | 11/2020 | Karner | F02N 11/0862 |
| 10,840,570 | B2* | 11/2020 | Lebreux | H01M 50/502 |
| 10,886,757 | B2* | 1/2021 | Zuo | H01M 10/63 |
| 10,914,789 | B2* | 2/2021 | Lemkin | G01R 31/3842 |
| 10,921,381 | B2* | 2/2021 | Karner | G08B 25/001 |
| 10,938,628 | B2* | 3/2021 | Dan | H04L 41/0668 |
| 10,971,771 | B2* | 4/2021 | Dan | H02J 7/0029 |
| 10,992,327 | B2* | 4/2021 | Hou | H03H 7/0115 |
| 11,041,911 | B2* | 6/2021 | Pan | G01R 31/396 |
| 11,050,287 | B2* | 6/2021 | Zhang | H02J 7/0047 |
| 2007/0210758 | A1* | 9/2007 | Gangstoe | H02J 7/0029 320/134 |
| 2012/0112685 | A1* | 5/2012 | Hartley | B60L 58/22 320/106 |
| 2012/0166855 | A1* | 6/2012 | Holsen | H01M 10/425 713/340 |
| 2012/0181987 | A1* | 7/2012 | Lee | H02J 7/00308 320/128 |
| 2013/0247594 | A1* | 9/2013 | Sanders | F25B 49/00 62/56 |
| 2013/0279386 | A1* | 10/2013 | Sanders | B60R 16/03 370/311 |
| 2013/0285441 | A1* | 10/2013 | Sanders | G08C 17/02 307/9.1 |
| 2013/0285831 | A1* | 10/2013 | Sanders | G08C 17/02 340/870.01 |
| 2013/0325303 | A1* | 12/2013 | Kiuchi | G01R 31/396 701/112 |
| 2014/0018015 | A1* | 1/2014 | Sanders | H02J 4/00 455/90.1 |
| 2014/0347014 | A1* | 11/2014 | Lee | H02J 7/0016 320/134 |
| 2015/0028816 | A1 | 1/2015 | Lee | |
| 2015/0037656 | A1* | 2/2015 | Noda | H01M 10/425 429/149 |
| 2015/0189489 | A1* | 7/2015 | Banno | H04W 4/00 370/328 |
| 2015/0216273 | A1* | 8/2015 | Akin | H02J 50/40 135/16 |
| 2015/0216274 | A1* | 8/2015 | Akin | B23P 15/26 135/16 |
| 2015/0349547 | A1* | 12/2015 | Jeon | H02J 7/0047 320/134 |
| 2015/0374083 | A1* | 12/2015 | Akin | H02J 50/12 135/16 |
| 2016/0198818 | A1* | 7/2016 | Akin | H02J 7/0013 29/592.1 |
| 2017/0126032 | A1 | 5/2017 | Beaston | |
| 2017/0141589 | A1* | 5/2017 | Inoue | H02J 7/1423 |
| 2017/0229902 | A1 | 8/2017 | Kamikawa et al. | |
| 2017/0234932 | A1* | 8/2017 | Jeon | B60L 53/00 320/134 |
| 2017/0237128 | A1* | 8/2017 | Kubo | H01M 10/425 429/7 |
| 2018/0090952 | A1 | 3/2018 | Ota et al. | |
| 2018/0233931 | A1 | 8/2018 | Beaston | |
| 2018/0251102 | A1* | 9/2018 | Han | B60L 50/66 |
| 2019/0012916 | A1* | 1/2019 | Nordbruch | G08G 1/142 |
| 2019/0120880 | A1* | 4/2019 | Zhang | B60L 58/10 |
| 2019/0120906 | A1* | 4/2019 | Dan | G01R 15/146 |
| 2019/0242949 | A1* | 8/2019 | Lemkin | H01M 10/42 |
| 2019/0305386 | A1* | 10/2019 | Lee | H01M 10/486 |
| 2019/0334370 | A1* | 10/2019 | Kamikawa | H01M 10/4207 |
| 2019/0363550 | A1* | 11/2019 | Zuo | H02J 7/0029 |
| 2019/0363563 | A1* | 11/2019 | Zhang | H02J 7/0021 |
| 2020/0025829 | A1* | 1/2020 | Jeon | H02J 7/0016 |
| 2020/0029393 | A1* | 1/2020 | Talbert | H04W 92/02 |
| 2020/0083730 | A1* | 3/2020 | Dan | G01R 31/392 |
| 2020/0083917 | A1* | 3/2020 | Hou | H04B 1/0078 |
| 2020/0084090 | A1* | 3/2020 | Dan | H04L 41/0668 |
| 2020/0084624 | A1* | 3/2020 | Lu | H04L 9/3242 |
| 2020/0106278 | A1* | 4/2020 | Sung | H02J 50/40 |
| 2020/0212520 | A1* | 7/2020 | Dan | H01M 10/667 |
| 2020/0274369 | A1* | 8/2020 | Luo | B60L 58/10 |
| 2020/0300917 | A1* | 9/2020 | Dan | G01R 1/203 |
| 2020/0350935 | A1* | 11/2020 | Hou | H04B 1/18 |
| 2020/0400750 | A1* | 12/2020 | Du | H01M 10/48 |
| 2021/0043990 | A1* | 2/2021 | Dan | H02P 3/18 |
| 2021/0075069 | A1* | 3/2021 | Zuo | H01M 10/441 |
| 2021/0111443 | A1* | 4/2021 | Wang | B60L 3/0046 |
| 2021/0119549 | A1* | 4/2021 | Wang | H02J 7/007 |
| 2021/0146794 | A1* | 5/2021 | Ruan | H02J 7/007194 |
| 2021/0234209 | A1* | 7/2021 | Wang | B60L 3/0046 |

FOREIGN PATENT DOCUMENTS

| | | |
|---|---|---|
| CN | 205564907 U | 9/2016 |
| CN | 107464690 A | 12/2017 |
| CN | 107534187 A | 1/2018 |
| CN | 108183518 A | 6/2018 |
| EP | 2830187 A1 | 1/2015 |
| WO | 2013016188 A1 | 1/2013 |
| WO | 2018005631 A1 | 1/2018 |

OTHER PUBLICATIONS

The First Office Action and search report dated Sep. 15, 2020 for Chinese Application No. 201811061717.1, 10 pages.
The Second Office Action and search report dated Dec. 28, 2020 for Chinese Application No. 201811061717.1, 9 pages.
The Third Office Action dated Apr. 14, 2021 for Chinese Application No. 201811061717.1, 7 pages.

* cited by examiner

BATTERY MANAGEMENT SYSTEM WITH WIRELESS COMMUNICATION UNIT

CROSS-REFERENCE TO RELATED APPLICATION

This application is based upon and claims priority to Chinese Patent Application No. 201811061717.1, filed on Sep. 12, 2018, the content of which is incorporated herein by reference in its entirety.

FIELD

The present disclosure relates to a technical field of battery technology, and particularly to a battery management system.

BACKGROUND

The battery management system is a system to manage batteries. The battery management system comprises a Battery Management Unit (BMU), a Cell Measurement Circuit (CMC), a sensing device, and some electrically-controlled devices.

At present, the battery management unit is connected to the cell measurement circuit, the sensing device, and the electrically-controlled devices using wiring harnesses for interaction of information and instructions via wiring harnesses. With the development of the battery technology, the battery management system is getting more and more powerful, leading to an increased number of various components (including the cell measurement circuit, the sensing device, and the electrically-controlled devices) in the battery management system; an increased number of the wiring harnesses between the battery management unit and the cell measurement circuit, the sensing device, and the electrically-controlled devices; and a more complicated routing of the wiring harnesses. As a result, a battery pack may have a more complicated installation structure and the installation may be more difficult.

SUMMARY

A battery management system is provided by embodiments of the present disclosure, which can simplify the installation structure of the battery pack.

A battery management system is provided by embodiments of the present disclosure, comprising: a battery management unit, configured to receive status information of a battery module and status information of a battery pack, and to transmit a control instruction to one or more cell measurement circuits; the one or more cell measurement circuits, configured to collect the status information of the battery module, to transmit the status information of the battery module to the battery management unit, and to receive and execute the control instruction transmitted from the battery management unit; one or more sensing units, configured to collect the status information of the battery pack, and to transmit the status information of the battery pack to the battery management unit; wherein a wireless communication unit is disposed in the battery management unit, and a wireless communication unit is disposed in at least a portion of the one or more cell measurement circuits and/or at least a portion of the one or more sensing units, so that the battery management unit is connected to at least the portion of the one or more cell measurement circuits and/or at least the portion of the one or more sensing units by wireless communication.

Embodiments of the present disclosure provide a battery management system in which a wireless communication unit is disposed in a battery management unit in the battery management system. A wireless communication unit is disposed within at least a portion of the cell measurement circuits and/or at least a portion of the sensing units. The battery management unit is connected to at least the portion of the cell measurement circuits and/or at least the portion of the sensing units having the wireless communication unit disposed therein by wireless communication.

BRIEF DESCRIPTION OF THE DRAWINGS

To provide a better understanding of the present disclosure, the detail description of the present disclosure is described in conjunction with the accompanying figures, wherein same or similar reference numerals represent same or similar features.

DETAILED DESCRIPTION

Figure 1:
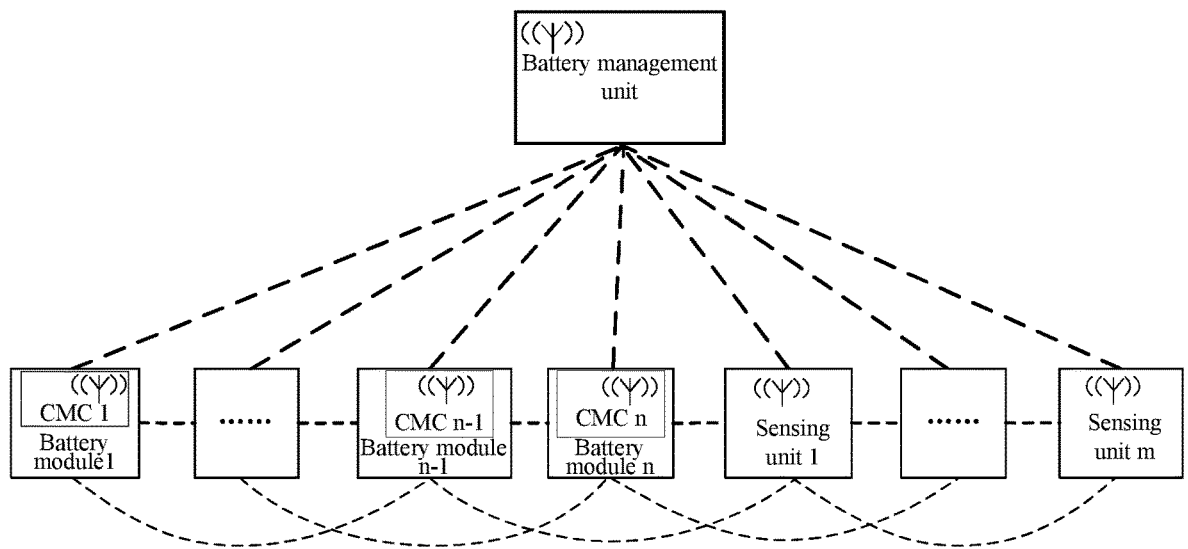
FIG. 1 is a structural schematic diagram of a battery management system according to an embodiment of the present disclosure.

Various aspects of features and exemplary embodiments of the present disclosure will be described in detail in the following. In the detailed description below, numerous specific details are set forth to provide a thorough understanding of the present disclosure. However, it is obvious to those skilled in the art that the present disclosure can be practiced without some of these specific details. The description of embodiments below is merely to provide a better understanding of the present disclosure by illustrating examples of the present disclosure. The present disclosure is not limited to any specific configuration and algorithm as described below, but instead, covers any modification, replacement and improvement to elements, components, and algorithms without departing from the spirit of the present disclosure. In the drawings and the following description, well known structures and technologies are not illustrated, in order to avoid obscuring the present disclosure.

A battery management system is provided by embodiments of the present disclosure that may be applied in a scenario where a battery pack is managed. The battery pack may include a plurality of battery modules. Each of the battery modules may include a plurality of battery cells. The battery management system may acquire relevant information from respective components of the battery pack, and manage or control the respective components of the battery pack according to the relevant information. Examples of the relevant information may include status information of the battery modules and status information of the battery pack.

A battery management system is provided by embodiments of the present disclosure that comprises a battery management unit, a cell measurement circuit, and a sensing unit. In an embodiment of the present disclosure, there may be a plurality of sensing units and cell measurement circuits in the battery management system. The numbers of the sensing units and the cell measurement circuits are not limited herein.

The battery management unit is configured to receive status information of the battery modules and status information of the battery pack, and to transmit a control instruction to the cell measurement circuit.

The battery management unit receives the status information of the battery modules, and may perform functions, such as crash signal monitoring, high-voltage interlock detection, heat management, high-voltage sampling, high-voltage insulation detection, high-voltage relay driving, high-voltage relay diagnosis, high-voltage pre-charging control, State Of Charge (SOC) calculation, State Of Health (SOH) calculation, cell measurement circuit management, sensing unit management and application policy selection, according to the status information of the battery modules.

The battery management unit may transmit the control instruction to the cell measurement circuit, so that the control instruction can be executed by the cell measurement circuit.

The cell measurement circuit is configured to collect the status information of the battery modules, to transmit the status information of the battery modules to the battery management unit, and to receive and execute the control instruction transmitted from the cell measurement circuit.

The cell measurement circuit may perform sampling and equalization functions. The status information of the battery modules is information capable of characterizing the status of the battery modules. The status information of the battery modules collected by the cell measurement circuit may include one or more of voltage information, temperature information, pressure information, humidity information, etc. The type of the status information of the battery modules is not limited herein.

The cell measurement circuit may receive a variety of control instructions transmitted by the battery management unit. For example, the control instruction may be an equalization instruction, a driving instruction, a sampling instruction, an instruction to control an operation mode of the cell measurement circuit, etc., which is not limited herein.

The sensing unit is configured to collect the status information of the battery pack and to transmit the status information of the battery pack to the battery management unit.

The status information of the battery pack is information capable of characterizing the status of the battery pack. For example, the status information of the battery pack may include one or more of current information, humidity information, and smoke concentration information, and may also include other information capable of characterizing the status of the battery pack. Details are not described herein.

In correspondence with the type of the status information of the battery pack, the sensing units may be one or more of a current sensor, a humidity sensor, and a smoke sensor, etc. The type and number of the sensing units are not limited herein.

A wireless communication unit is disposed within the battery management unit. A wireless communication unit is disposed within at least a portion of cell measurement circuits and/or at least a portion of sensing units. In this way, the battery management unit may be connected to at least the portion of the cell measurement circuits and/or at least the portion of the sensing units by wireless communication.

In some examples, a wireless communication unit may be disposed in a cell measurement circuit.

In other examples, a wireless communication unit may be disposed in a sensing unit.

In still other examples, a wireless communication unit may be disposed in both the cell measurement circuit and the sensing unit.

The wireless communication may include Bluetooth communication, ZigBee communication or Wireless-Fidelity (WiFi) or a custom-developed communication protocol, etc., which is not limited herein. The type of the wireless communication corresponds to the type of the wireless communication unit, and the type of the wireless communication unit is not limited herein.

In the embodiment of the present disclosure, a wireless communication unit is disposed within the battery management unit. A wireless communication unit is disposed within at least a portion of cell measurement circuits and/or at least a portion of sensing units. The battery management unit may be connected to at least the portion of the cell measurement circuits and/or at least the portion of the sensing units having the wireless communication unit disposed therein by wireless communication. In this way, the wiring harnesses for connecting respective parts of the battery management system may be reduced or even eliminated, so as to simplify or eliminate routing of the wiring harnesses, simplify the installation structure of the battery management system, and reduce difficulty in installing the battery pack.

Moreover, the battery management unit may be connected to at least the portion of the sensing units and/or at least the portion of the cell measurement circuits in the battery management system by wireless communication, which can lead to a reduced or eliminated effect of wiring harnesses on the installation of the battery modules, and a more flexible installation of the battery modules. Without connections implemented through wiring harnesses, there is no need of crimp terminals, wires and connectors, thereby avoiding an inconsistent terminal crimping, a poor contact between the crimp terminals and the connectors after the crimp terminals are vibrated for a long time, and adverse effects caused by aging of the wiring harnesses.

In some examples, if a first functional unit fails to communicate with the battery management unit, the first functional unit may be configured to establish a wireless communication connection with a second functional unit and communicate with the battery management unit via the second functional unit.

In some other examples, if the first functional unit fails to communicate with the battery management unit, the first functional unit may change a frequency of communication with the battery management unit and establish a wireless communication connection with the battery management unit again.

The first functional unit may be any of the sensing units or the cell measurement circuits having a wireless communication unit disposed therein. The second functional unit may be any of the sensing units or the cell measurement circuits having a wireless communication unit disposed therein, other than the first functional unit.

FIG. 1 is a schematic structural diagram of a battery management system according to an embodiment of the present disclosure. As shown in FIG. 1, the battery management system includes a battery management unit BMU, a plurality of sensing units Sensor 1 to Sensor m, and a plurality of cell measurement circuits CMC 1 to CMC n. The dashed line in FIG. 1 represents a wireless communication connection.

A wireless communication unit may be disposed within the battery management unit. A wireless communication unit may be disposed within each of the sensing units. A wireless communication unit may be disposed within each of the cell measurement circuits. The battery management unit may be connected to each of the cell measurement circuits and each of the sensing units by wireless communication.

Since there is a wireless communication unit disposed in each of the sensing units and each of the cell measurement circuits, wireless communication may be performed between the sensing units, between the cell measurement circuits, and between the sensing units and the cell measurement circuits.

If a sensing unit or a cell measurement circuit fails to communicate with the battery management unit, a wireless communication connection may be established with the battery management unit via another sensing unit or another cell measurement circuit respectively. Alternatively, the sensing unit or the cell measurement circuit, which fails to communicate with the battery management unit, may change the communication frequency and re-establish a wireless communication connection with the battery management unit.

For example, as shown in FIG. 1, if the cell measurement circuit CMC n fails to wirelessly communicate with the battery management unit, the cell measurement circuit CMC n may establish a wireless communication connection with the cell measurement circuit CMC n−1 that performs wireless communication with the battery management unit successfully. Then the cell measurement circuit CMC n−1 may serve as a forwarding node to allow wireless communication between the cell measurement circuit CMC n and the battery management unit. Alternatively, the cell measurement circuit CMC n may establish a wireless communication connection with the sensing unit Sensor 2 that performs wireless communication with the battery management unit successfully. Then the sensing unit Sensor 2 may serve as a forwarding node to allow wireless communication between the cell measurement circuit CMC n and the battery management unit.

As another example, if the cell measurement circuit CMC 1 fails to wirelessly communicate with the battery management unit using a communication frequency of f1, the cell measurement circuit CMC 1 may change the communication frequency to f2, and re-establish a wireless communication connection with the battery management unit, wherein $f1 \neq f2$.

Figure 2:
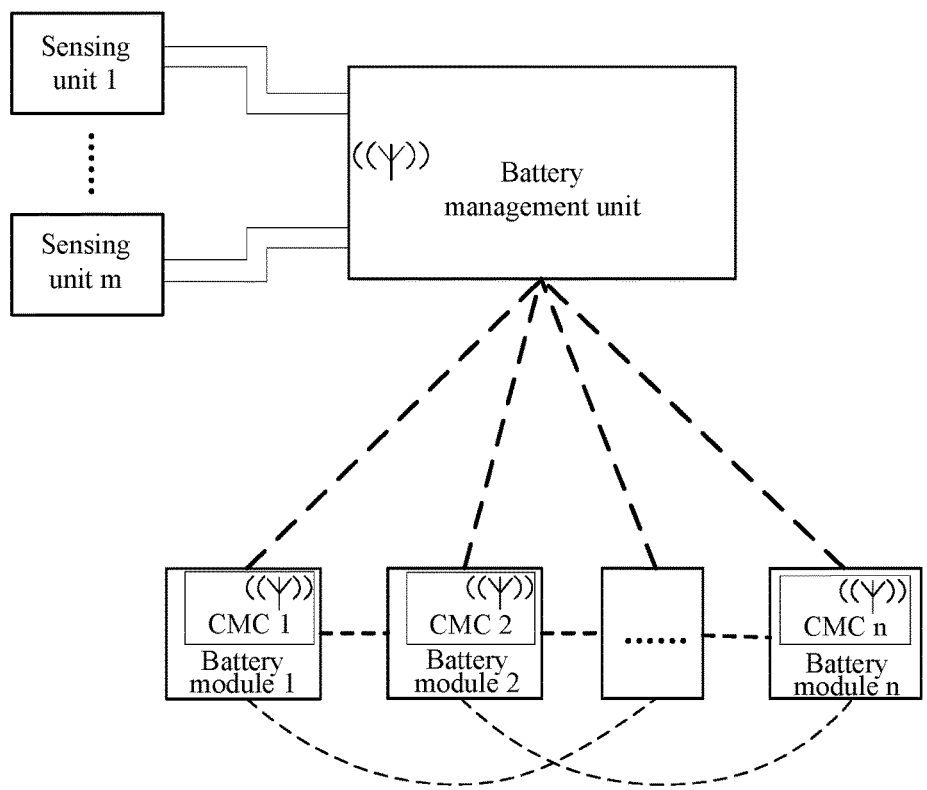
FIG. 2 is a structural schematic diagram of a battery management system according to another embodiment of the present disclosure.

FIG. 2 is a schematic structural diagram of a battery management system according to another embodiment of the present disclosure. As shown in FIG. 2, the battery management system includes a battery management unit BMU, a plurality of sensing units Sensor 1 to Sensor m, and a plurality of cell measurement circuits CMC 1 to CMC n.

Figure 3:
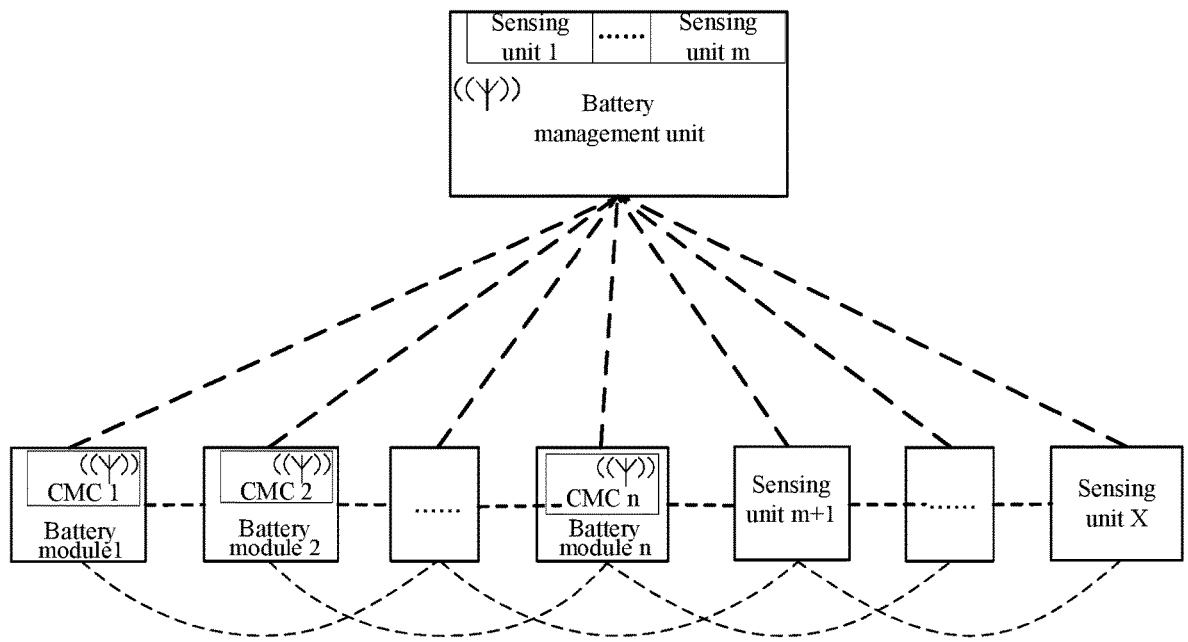
FIG. 3 is a structural schematic diagram of an example of a battery management system according to another embodiment of the present disclosure.

A wireless communication unit may be disposed in the cell measurement circuit, and the battery management unit and the cell measurement circuit may be connected by wireless communication. The battery management unit and the sensing units may be connected by wired communication. For example, FIG. 3 is a schematic structural diagram of an example of a battery management system according to another embodiment of the present disclosure. As shown in FIG. 3, the sensing units may be integrated on a Printed Circuit Board (PCB) included in the battery management unit, and a wired communication connection between the battery management unit and the sensing units may be specifically implemented by connecting through the routing on the printed circuit board. The integration of the sensing units with the battery management unit may be implemented using a Printed Circuit Board Assembly (PCBA).

It is noted that the battery management system may further include a sensing unit besides the sensing units Sensor 1 to Sensor m mounted on the printed circuit board included in the battery management unit, such as a sensing unit sensor X in wireless communication with the battery management unit in FIG. 3. The battery management system may further include other sensing units in wireless communication with the battery management unit, which is not limited herein.

If a cell measurement circuit fails to wirelessly communicate with the battery management unit, the cell measurement circuit may establish a wireless communication connection with another cell measurement circuit. The another cell measurement circuit may serve as a forwarding node to allow a wireless communication connection between the cell measurement circuit and the battery management unit.

If a cell measurement circuit fails to wirelessly communicate with the battery management unit, the cell measurement circuit may change the communication frequency, and re-establish a wireless communication connection with the battery management unit using the changed communication frequency.

Figure 4:
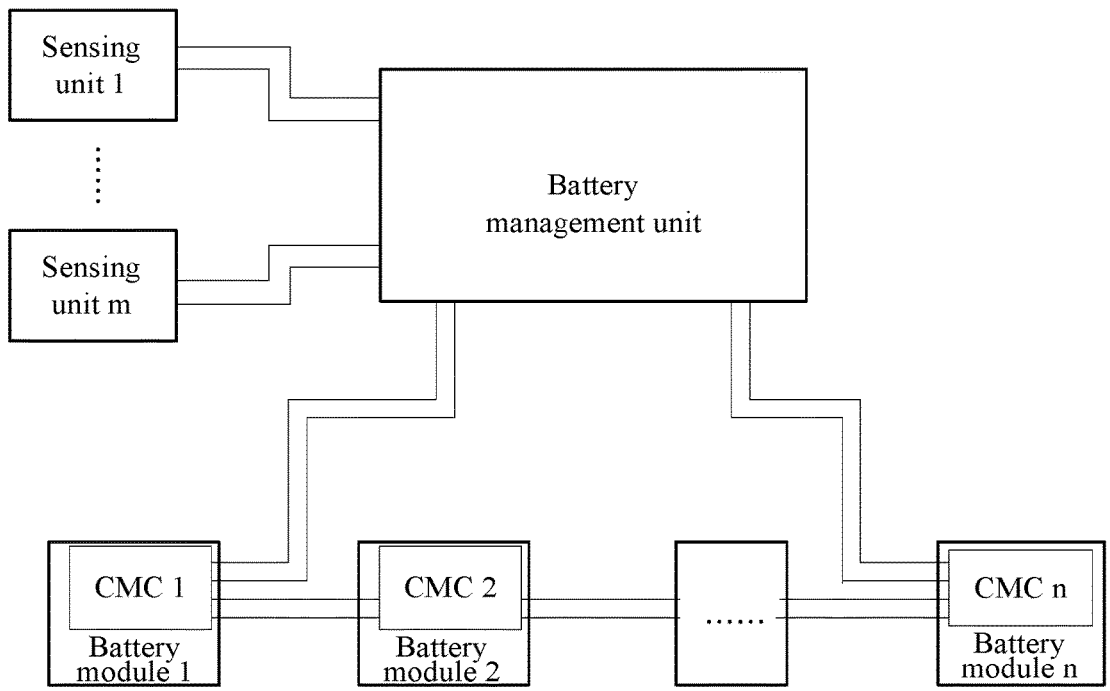
FIG. 4 is a structural schematic diagram of a battery management system according to prior arts.

FIG. 4 is a schematic structural diagram of a battery management system according to prior arts. As shown in FIG. 4, the cell measurement circuits corresponding to respective battery modules in the battery pack of the battery management system are in serial communication. The cell measurement circuits located in the first place and in the last place are connected to the battery management unit using wired communication after a communication isolation transformation. If there is interference on one of the cell measurement circuits, which leads to a communication failure, each of cell measurement circuits which are located by the side of the cell measurement circuit suffering from the interference cannot transmit the status information of the battery modules to the battery management unit, resulting in a significant impact on electromagnetic compatibility performance of communications.

In the battery management system according to embodiments of the present disclosure, each of the cell measurement circuits is connected to the battery management unit using wireless communication. In the case where a communication failure occurs due to the existence of interference on an individual cell measurement circuit, the communication between the cell measurement circuit suffering from the interference and the battery management unit may be performed by selecting another cell measurement circuit as a forwarding node or by changing the frequency of communication between the cell measurement circuit suffering from the interference and the battery management unit. As a result, the electromagnetic compatibility performance of communications is improved.

In a battery management system according to still another embodiment, a battery management unit BMU, a plurality of sensing units Sensor 1 to Sensor m, and a plurality of cell measurement circuits CMC 1 to CMC n are included.

Figure 5:
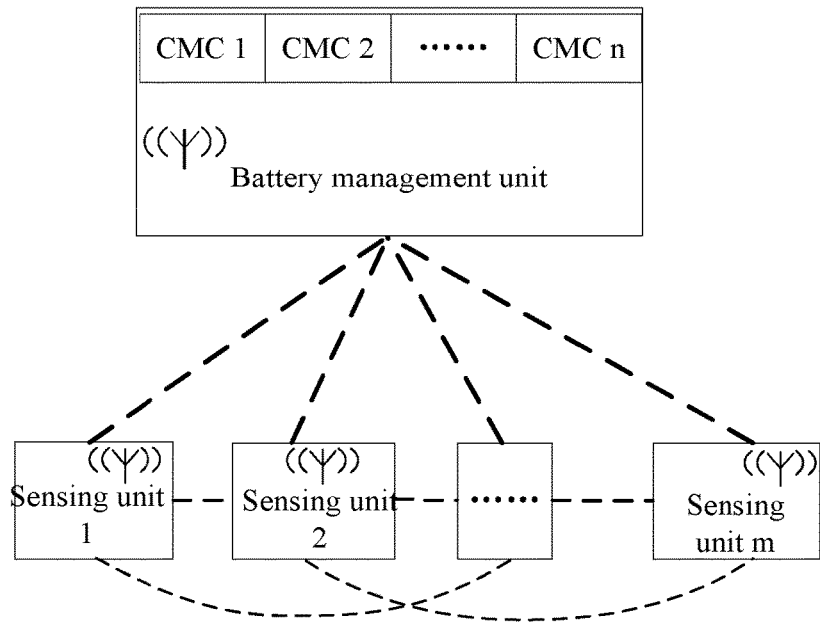
FIG. 5 is a structural schematic diagram of an example of a battery management system according to still another embodiment of the present disclosure.

A wireless communication unit may be disposed in the sensing unit. The battery management unit may be connected to the sensing units by wireless communication. The battery management unit may be connected to each of the cell measurement circuits by wired communication. For example, FIG. 5 is a schematic structural diagram of an example of a battery management system according to still another embodiment of the present disclosure. As shown in FIG. 5, the cell measurement circuits may be integrated on a printed circuit board included in the battery management unit, and a wired communication connection between the battery management unit and the cell measurement circuits may be specifically implemented by connecting through the routing on the printed circuit board. The integration of the cell measurement circuits with the battery management unit may be implemented by a printed circuit board assembly.

If a sensing unit fails to wirelessly communicate with the battery management unit, the sensing unit may establish a wireless communication connection with another sensing unit. The another sensing unit may serve as a forwarding node to allow a wireless communication connection between the sensing unit and the battery management unit.

If a sensing unit fails to wirelessly communicate with the battery management unit, the sensing unit may change the communication frequency and re-establish a wireless communication connection with the battery management unit using the changed communication frequency.

Figure 6:
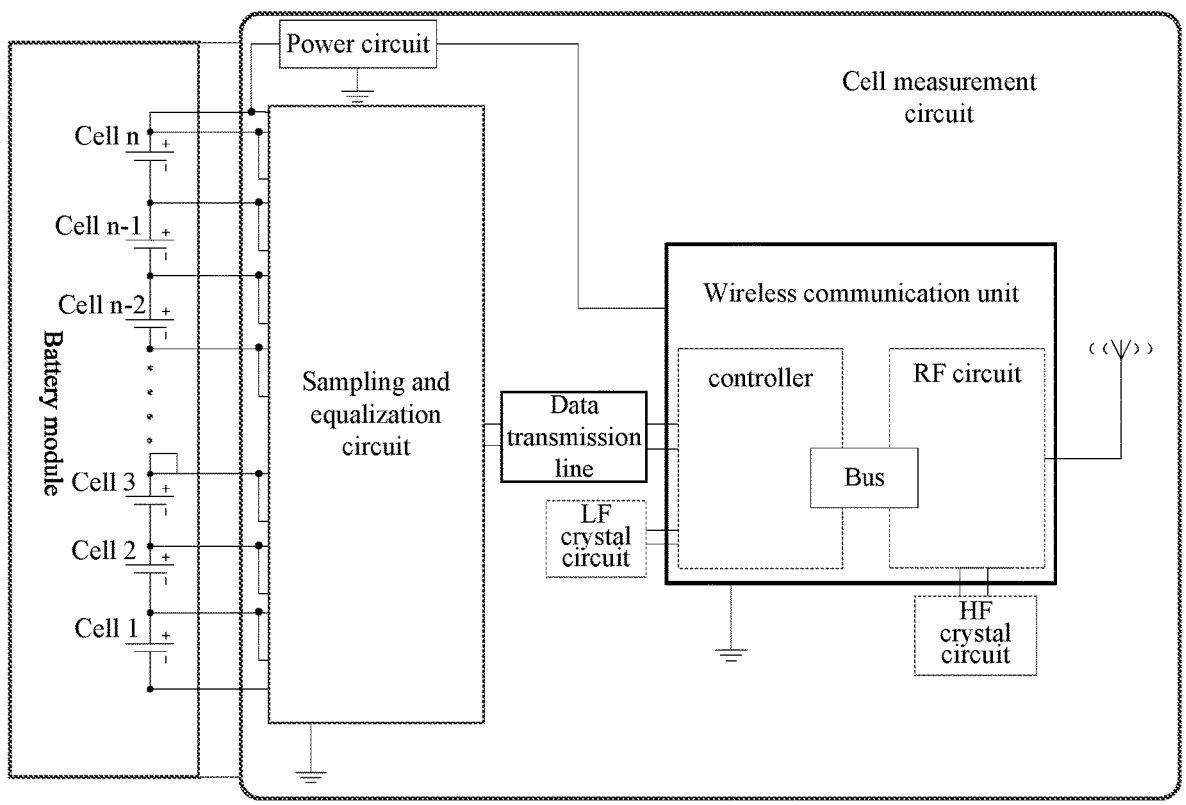
FIG. 6 is a structural schematic diagram of a cell measurement circuit according to an embodiment of the present disclosure.

FIG. 6 is a schematic structural diagram of a cell measurement circuit according to an embodiment of the present disclosure. As shown in FIG. 6, the cell measurement circuit in above-mentioned embodiments may include a sampling and equalization circuit and a wireless communication unit. The cell measurement circuit is connected to a battery module including battery cells Cell 1 to Cell n.

The sampling and equalization circuit may be connected to the battery module and the wireless communication unit. The sampling and equalization circuit may be powered by the battery module without the need of a power supply dedicated for the sampling and equalization circuit, thus further simplifying the structure of the battery management system. Specifically, the cell measurement circuit may further include a first power circuit. The first power circuit may be connected to the wireless communication units in the battery module, the sampling and equalization circuit, and the cell measurement circuit. The first power circuit may be used to convert a voltage supplied by the battery module into a voltage suitable for the wireless communication units in the sampling and equalization circuit and the cell measurement circuit. In other words, the wireless communication units in the sampling and equalization circuit and the cell measurement circuit are powered by the battery module after the voltage conversion by the first power circuit.

The sampling and equalization circuit may communicate with the wireless communication unit through data transmission lines using a communication protocol. For example, a Universal Asynchronous Receiver/Transmitter (UART) protocol, a Synchronous Serial Interface (SSI) protocol, an Inter-Integrated Circuit (I2C) protocol, or an Inter-integrated Circuit Sound (I2S) protocol may be used, which is not limited herein.

The sampling and equalization circuit may be used to collect the status information of the battery module from the battery module, to transmit the status information of the battery module to the battery management unit via the wireless communication unit, to receive the control instruction from the battery management unit via the wireless communication unit, and to execute the control instruction. For example, the control instruction may include an equalization instruction, and the sampling and equalization circuit receives and executes the equalization instruction to equalize the battery module.

In some examples, a radio frequency (RF) circuit may be externally connected to a High Frequency (HF) crystal circuit. A controller may be externally connected to a Low Frequency (LF) crystal circuit.

The sampling and equalization circuit in the above-mentioned embodiments may include an active equalization circuit. Alternatively, the sampling and equalization circuit may include a passive equalization circuit.

Figure 7:
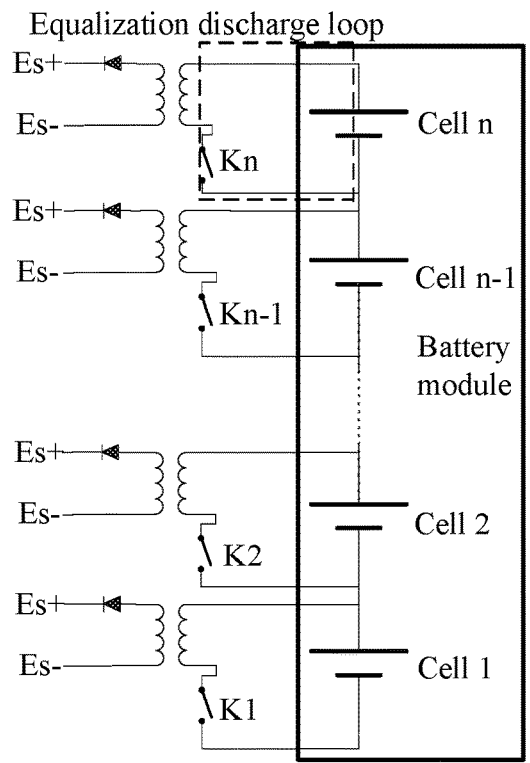
FIG. 7 is a structural schematic diagram of an active equalization circuit according to an embodiment of the present disclosure.

For example, FIG. 7 is a schematic structural diagram of an active equalization circuit according to an embodiment of the present disclosure. As shown in FIG. 7, the battery module includes battery cells Cell 1 to Cell n. An equalization discharge loop is disposed in each of the battery cells. The equalization discharge loop includes a switching device. The switching devices in FIG. 7 include K1 to Kn. The equalization discharge may be implemented by on-off control of the switching device in the equalization discharge circuit. An energy storage device (Es+ and Es− in FIG. 7 indicate respective ends of the energy storage device) is disposed in each of the equalization discharge circuits, which may store energies released by the battery cells.

For example, when it is detected that a voltage difference between any two of the battery cells Cell 1 to Cell n is above a reference threshold, the equalization discharge is started from the battery cell with the highest voltage, the switching device in the equalization discharge circuit corresponding to the battery cell with the highest voltage is turned on, and energies released by the battery cell with the highest voltage may be stored into the energy storage device by the battery cell through a bidirectional DC/DC (Direct Circuit to Direct Circuit) converter. When it is detected that a voltage difference between any two of the battery cells Cell 1 to Cell n is above the reference threshold again, the above-mentioned steps of the equalization discharge are repeated to perform the equalization discharge on the battery cell currently having the highest voltage, until the voltage difference between any two of the battery cells Cell 1 to Cell n is below or equal to the reference threshold.

The energy storage device described above may be a battery module, a lead acid battery, a capacitor, etc., and the type of the energy storage device is not limited herein.

Figure 8:
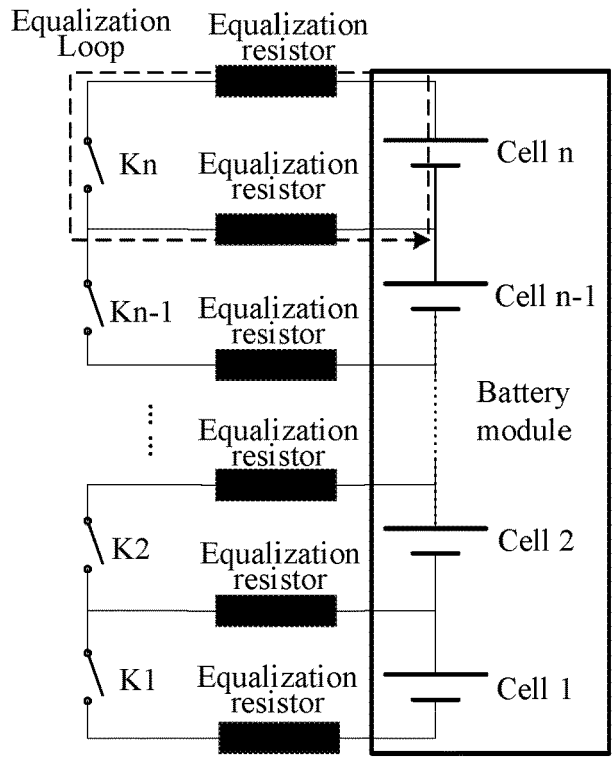
FIG. 8 is a structural schematic diagram of a passive equalization circuit according to an embodiment of the present disclosure.

For example, FIG. 8 is a schematic structural diagram of a passive equalization circuit according to an embodiment of the present disclosure. As shown in FIG. 8, the battery module includes battery cells Cell 1 to Cell n. An equalization loop is disposed in each of the battery cells. The equalization loop includes a switching device and equalization resistors. Two adjacent battery cells may share one of the equalization resistors. The switching devices in FIG. 8 include K1 to Kn. The power consumption of the battery cell is implemented by on-off control of the switching device in the equalization loop.

For example, when it is detected that a voltage difference between any two of the battery cells Cell 1 to Cell n is above a reference threshold, both of the two battery cells having a voltage difference above the reference threshold start to be equalized. The switching devices in the equalization loops corresponding to the two battery cells having the voltage difference above the reference threshold are turned on, and energies of the two battery cells are consumed by the equalization resistors in the equalization loops. The equalization is repeated until the voltage difference between any two of the battery cells Cell 1 to Cell n is below or equal to the reference threshold.

The switching device in the above-mentioned example may be a Metal-Oxide-Semiconductor Field-Effect Transistor (MOSFET) or the like, and the type of the switching device is not limited herein.

In some examples, the battery management unit may include a second power circuit. The second power circuit is connected to the wireless communication unit in the battery management unit and an external power supply. The second power circuit is used to convert a voltage supplied by the external power supply into a voltage suitable for the wireless communication unit in the battery management unit. In other words, the wireless communication unit in the battery management unit is powered by the external power supply after the voltage conversion by the second power circuit.

The external power supply may be an energy storage battery, such as a lead acid battery disposed in electrical equipment. The external power supply may be a commercial power, which is not limited herein. For example, if the battery management system is used in a new-energy vehicle, the external power supply may be a lead acid battery on low-voltage side of the vehicle.

While a device, in which the battery management system is located, is started, the battery management unit may be enabled in response to a device start signal. Specifically, the device may be started in response to receiving the device start signal. At the same time, the battery management unit may also be enabled and start to work. In some examples, the battery management unit may be powered by an external power supply after processing by a power circuit. In other words, the power circuit directly transports power to the battery management unit. When the device receives the device start signal, the power circuit is enabled, so that the power circuit transports power to the battery management unit and thus the battery management unit is enabled. For example, if the device in which the battery management system is located is a new-energy vehicle, the device start signal may be specifically a vehicle ignition signal. When the new-energy vehicle receives the vehicle ignition signal, the power circuit is enabled, and thus the battery management unit is enabled.

A battery management unit may be used to transmit a control instruction to the cell measurement circuit. In some examples, the control instruction indicates the operating mode of the cell measurement circuit. The cell measurement circuit receives and executes the control instruction indicating the operation mode of the cell measurement circuit, and enters into the operation mode indicated by the control instruction.

For example, the operating mode of the cell measurement circuit may include a working mode, a sleep mode, and a low-power mode. The working mode is a mode in which the cell measurement circuit works continuously. In the working mode, the cell measurement circuit continuously collects the status information of the battery module, and periodically detects the status of the battery module according to the continuously collected status information of the battery module. The sleep mode is a mode in which the cell measurement circuit stops working. In the sleep mode, the cell measurement circuit stops collecting the status information of the battery module, and also stops periodically detecting the status of the battery module. The low-power mode is a mode in which the cell measurement circuit works intermittently. In the low-power mode, the cell measurement circuit intermittently collects the status information of the battery module, and periodically detects the status of the battery module according to the intermittently collected status information of the battery module. It is noted that the period of detecting the status of the battery module by the cell measurement circuit in the low-power mode is longer than that in the working mode. For example, the period of detecting the status of the battery module by the cell measurement circuit in the low-power mode is 1 second, while the period of detecting the status of the battery module by the cell measurement circuit in the working mode is 100 milliseconds. The cell measurement circuit may enter into the low-power mode before the device in which the battery management system is located stops working.

In some examples, the wireless communication unit in the battery management unit may be powered directly by the external power supply. The battery management unit may further include a third power circuit. The third power circuit may be connected to the external power supply and other portions of the battery management unit except the wireless communication unit. The other portions of the battery management unit except the wireless communication unit are powered by the external power supply after processing by the third power circuit.

For example, if the device in which the battery management system is located is a new-energy vehicle, the wireless communication unit in the battery management unit may be directly powered by the lead acid battery on low-voltage side of the new-energy vehicle. The other portions of the battery management unit except the wireless communication unit may be powered by the lead acid battery on low-voltage side of the new-energy vehicle after processing by the third power circuit.

If the cell measurement circuit in the low power mode periodically detects the status of the battery module according to the intermittently collected status information of the battery module and determines that the battery module is in an abnormal status, the wireless communication unit in the cell measurement circuit may be configured to transmit an alarm signal to the wireless communication unit in the battery management unit. In some examples, the cell measurement circuit may transmit the status information of the battery module which is in the abnormal status to the wireless communication unit in the battery management unit by using the wireless communication unit in the cell measurement circuit.

The wireless communication unit in the battery management unit is configured to receive the alarm signal and transmit a wake-up signal to the third power circuit. The third power circuit receives the wake-up signal, and then starts to work and supplies power to the other portions of the battery management unit except the wireless communication unit, so that the battery management unit is enabled and starts to work. When the battery management unit starts to work, it may transmit an alarm message to inform users or operators of the abnormal status of the battery module. For example, if the device in which the battery management system is located is a new-energy vehicle, the third power circuit receives the alarm signal transmitted by the wireless communication unit in the battery management unit, and then starts to work and supplies power to other portions of the battery management unit except the wireless communication unit. When the battery management unit starts to work, it may transmit an alarm message to the vehicle. The specific form of the alarm message is not limited herein.

In some examples, the wireless communication unit described above may include a controller and a radio frequency circuit, wherein the controller is connected to the radio frequency circuit via a bus. In some examples, the controller may be a Micro Control Unit (MCU) or the like, which is not limited herein.

Figure 9:
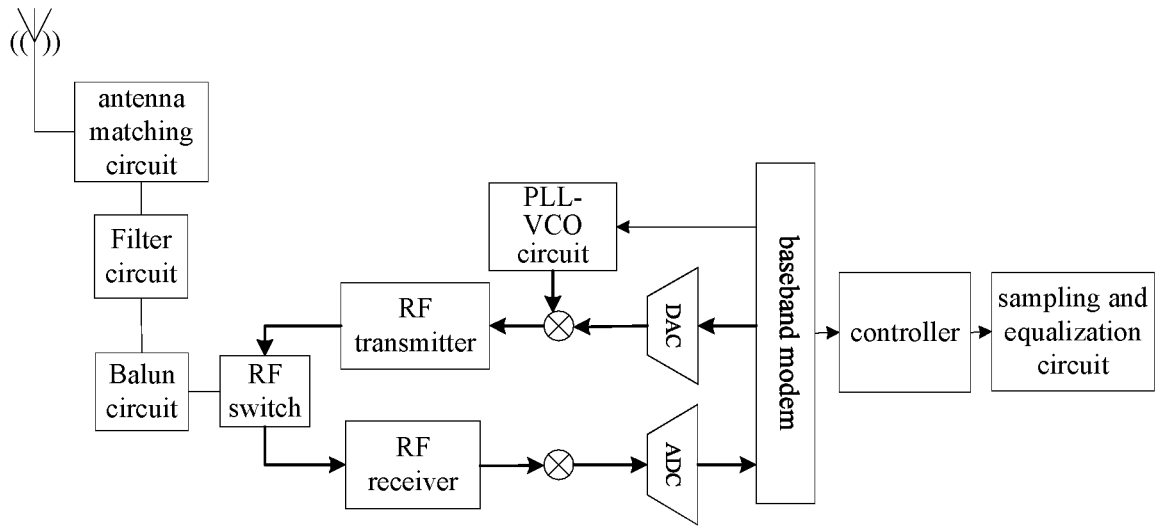
FIG. 9 is a schematic diagram illustrating information transmission during communication of a wireless communication unit according to an embodiment of the present disclosure.
Figure 10:
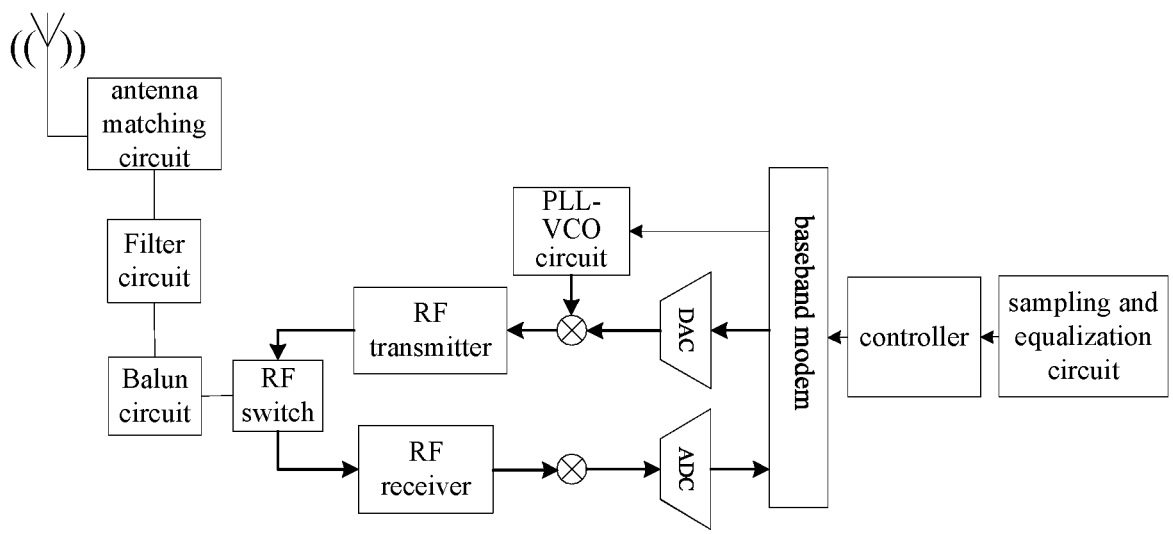
FIG. 10 is a schematic diagram illustrating information transmission during communication of a wireless communication unit according to an embodiment of the present disclosure.

For example, FIG. 9 and FIG. 10 are both schematic diagrams of information transmission during communication of a wireless communication unit according to an embodiment of the present disclosure. As shown in FIG. 9 and FIG. 10, the radio frequency circuit may include an antenna, an antenna matching circuit, a filter circuit, a balun circuit, a radio frequency switch, a radio frequency receiver, a radio frequency transmitter, a Digital-to-Analog converter (DAC), an Analog-to-Digital Converter (ADC), Phase Locked Loop Voltage Controlled Oscillator (PLL-VCO) circuit, and a baseband modem. The arrows in FIG. 9 and FIG. 10 indicate flow directions of signals.

Referring to FIG. 9, the process of receiving a signal by the cell measurement circuit (the signal may carry the control instruction and the like) is taken as an example of the information transmission. The signal (an electromagnetic wave signal) transmitted by the battery management unit is received via the antenna. The received signal passes through the antenna matching circuit, the filter circuit, and the balun circuit in sequential, and is processed to get a differential analog signal. Then the differential analog signal passes through the radio frequency switch, the radio frequency receiver, and the ADC to be converted into a digital signal which is then transmitted to the baseband modem for processing. The processed digital signal is transmitted to the sampling and equalization circuit via the controller.

In some examples, the baseband modem may further process the digital signal to get information that can be identified by the sampling and equalization circuit, and output the information directly to the sampling and equalization circuit. In other words, the controller may be omitted, and the information processing performed by the controller may be implemented in a Digital Signal Processing (DSP) unit or a hard core within the baseband modem.

Referring to FIG. 10, the process of transmitting a signal by the cell measurement circuit (the signal may carry the status instruction of the battery module and the like) is taken as an example of the information transmission. Information which needs to be transmitted to the cell measurement circuit, such as voltage information, temperature information, etc., is input to the baseband modem for quantization, and then a digital signal is obtained. The digital signal is converted into an analog signal by the DAC, and the transmitted signal is synchronized with an oscillatory signal in the radio frequency circuit by the PLL-VCO. The analog signal sequentially passes through the radio frequency transmitter, the radio frequency switch, the balun circuit, the filter circuit, and the antenna matching circuit, reaches the antenna and is sent out.

In some examples, the antenna device in the above-mentioned embodiment may be mounted on a circuit board or may be mounted outside the circuit board depending on structures of the battery pack and the battery module. If the antenna device is mounted outside the circuit board, it may be connected to the circuit board via a cable.

It should be clearly noted that the various embodiments in the specification are all described in a progressive manner. The same or similar parts of the embodiments may be referred to each other, and the difference of an embodiment from another embodiment has been illustrated in detail. The features, structures, or characteristics described in the above-mentioned embodiments may be combined in one or more embodiments in any suitable manner. Those skilled in the art will recognize that the technical solution of the present disclosure may be practiced without one or more of the specific details, or may employ other methods, components, materials, and the like. In other instances, well-known structures, materials, or operations are not shown or described in detail to avoid obscuring the major conception of the present disclosure. The present disclosure is not limited to the specific structures described above and shown in the drawings. Various alterations, modifications, and additions may be made by those skilled in the art in the light of the spirit of the present disclosure. For the purpose of brevity, a detailed description of known techniques is omitted herein.

The function block shown in the structural diagram described above may be implemented as hardware, software, firmware, or a combination thereof. When implemented as hardware, it may be, for example, an electronic circuit, an application specific integrated circuit (ASICs), a suitable firmware, a plug-in, a function card, and so forth. When implemented as software, the element of the present disclosure is a program or a code segment used to perform the required task. The program or code segment may be stored in a machine-readable medium or transmitted over a transmission medium or a communication link through a data signal carried in a carrier wave. The "machine-readable medium" may include any medium capable of storing or transmitting information. Examples of the machine-readable medium include electronic circuits, semiconductor memory devices, ROMs, flash memories, erasable ROMs (EROM), floppy disks, CD-ROMs, optical disks, hard disks, optical media, radio frequency (RF) links, and so forth. The code segment may be downloaded via a computer network such as Internet, intranet, or the like.

What is claimed is:

1. A battery management system, comprising:
a battery management unit, configured to receive status information of one or more battery modules and status information of a battery pack, and to transmit a control instruction to one or more cell measurement circuits, wherein the battery pack contains the one or more battery modules, and the one or more battery modules contain each one or more cells;
wherein the one or more cell measurement circuits are configured to collect the respective status information of the one or more battery modules, to transmit the status information of the one or more battery modules to the battery management unit, and to receive and execute the control instruction transmitted from the battery management unit;
one or more sensing units, configured to collect the status information of the battery pack, and to transmit the status information of the battery pack to the battery management unit,
wherein the battery management system is characterized in that:
a wireless communication unit is disposed in the battery management unit, and a wireless communication unit is disposed in at least one cell measurement circuit of the one or more cell measurement circuits, so that the battery management unit is connected to the at least one cell measurement circuit of the one or more cell measurement circuits by wireless communication, and/or a wireless communication unit is disposed in at least one sensing unit of the one or more sensing units, so that the battery management unit is connected to the at least one sensing unit of the one or more sensing units by wireless communication; and if a first functional unit fails to communicate with the battery management unit, the first functional unit is configured to establish a wireless communication connection with a second functional unit, and to communicate with the battery management unit via the second functional unit; or if the first functional unit fails to communicate with the battery management unit, the first functional unit is configured to change a frequency of communication with the battery management unit, and to establish a wireless communication connection with the battery management unit again;

wherein the first functional unit is any one of the one or more sensing units or the one or more cell measurement circuits having a wireless communication unit disposed therein, and the second functional unit is any one of the one or more sensing units or the one or more cell measurement circuits having a wireless communication unit disposed therein, other than the first functional unit, wherein a wireless communication unit is disposed in each of the one or more sensing units, a wireless communication unit is disposed in each of the one or more cell measurement circuits, and the battery management unit is connected to all of the one or more cell measurement circuits and the one or more sensing units by wireless communication, operating modes of the one or more cell measurement circuits comprise a working mode, a sleep mode, and a low-power mode, the wireless communication unit in the battery management unit is directly powered by an external power supply, the battery management unit further comprises a further power circuit connected to the external power supply and other portions of the battery management unit except the wireless communication unit, and the other portions of the battery management unit except the wireless communication unit are powered by the external power supply after processing by the further power circuit;

a cell measurement circuit in the low-power mode is specifically configured to intermittently collect the status information of the battery module and to periodically detect a status of the battery module according to the intermittently collected status information of the battery module; and to utilize the wireless communication unit in the cell measurement circuit to transmit an alarm signal to the wireless communication unit in the battery management unit if the battery module is determined to be in an abnormal status;

the wireless communication unit in the battery management unit is further configured to receive the alarm signal, and to transmit a wake-up signal to the further power circuit; and the further power circuit is configured to start to work in response to receiving the wake-up signal, so as to supply power to the other portions of the battery management unit except the wireless communication unit and enable the battery management unit.

2. The battery management system according to claim 1, wherein each cell measurement circuit comprises a sampling and equalization circuit and a wireless communication unit;

the sampling and equalization circuit is connected to the battery module and the wireless communication unit, and the sampling and equalization circuit is configured to collect the status information of the battery module from the battery module, to transmit the status information of the battery module to the battery management unit via the wireless communication unit, and to receive the control instruction from the battery management unit via the wireless communication unit and execute the control instruction.

3. The battery management system according to claim 1, wherein the wireless communication unit comprises a controller and a radio frequency circuit, and the controller is connected to the radio frequency circuit via a bus.

4. The battery management system according to claim 1, wherein the battery management unit is further configured to be enabled in response to a device start signal.

5. The battery management system according to claim 1, wherein the status information of the battery pack comprises one or more of:

current information, humidity information, and smoke concentration information.

6. The battery management system according to claim 1, wherein the status information of the battery module comprises one or more of:

voltage information, temperature information, pressure information, and humidity information.

7. The battery management system according to claim 1, wherein the wireless communication unit comprises a controller and a radio frequency circuit, and the controller is connected to the radio frequency circuit via a bus.

* * * * *